(12) United States Patent
Kimura et al.

(10) Patent No.: US 10,861,944 B2
(45) Date of Patent: Dec. 8, 2020

(54) SEMICONDUCTOR DEVICE AND METHOD FOR MANUFACTURING THE SAME

(71) Applicant: Kabushiki Kaisha Toshiba, Minato-ku (JP)

(72) Inventors: Shigeya Kimura, Yokohama (JP);
Hisashi Yoshida, Kawasaki (JP);
Tatsuo Shimizu, Shinagawa (JP);
Ryosuke Iijima, Setagaya (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 16/566,997

(22) Filed: Sep. 11, 2019

(65) Prior Publication Data
US 2020/0251562 A1     Aug. 6, 2020

(30) Foreign Application Priority Data
Feb. 4, 2019   (JP) .................................. 2019-018150

(51) Int. Cl.
*H01L 29/417*     (2006.01)
*H01L 29/20*     (2006.01)
(Continued)

(52) U.S. Cl.
CPC ...... *H01L 29/2003* (2013.01); *H01L 29/1608* (2013.01); *H01L 21/043* (2013.01); *H01L 21/0485* (2013.01); *H01L 21/28525* (2013.01); *H01L 29/41725* (2013.01); *H01L 29/456* (2013.01)

(58) Field of Classification Search
CPC .............. H01L 21/043; H01L 21/0485; H01L 21/28525; H01L 29/41725; H01L 29/456
See application file for complete search history.

(56) References Cited

U.S. PATENT DOCUMENTS

| | | | |
|---|---|---|---|
| 7,576,373 B1* | 8/2009 | Hikita ............... | H01L 29/66462 257/192 |
| 2005/0056850 A1* | 3/2005 | Taki ........................ | H01L 33/32 257/79 |

(Continued)

FOREIGN PATENT DOCUMENTS

| | | |
|---|---|---|
| JP | 2008-071832 A | 3/2008 |
| JP | 2010-056298 A | 3/2010 |

(Continued)

*Primary Examiner* — George R Fourson, III
(74) *Attorney, Agent, or Firm* — Oblon, McClelland, Maier & Neustadt, L.L.P.

(57) ABSTRACT

According to one embodiment, a semiconductor device includes a first layer, a first electrode, and a first nitride region. The first layer includes a first material and a first partial region. The first material includes at least one selected from the group consisting of silicon carbide, silicon, carbon, and germanium. The first partial region is of a first conductivity type. The first conductivity type is one of an n-type or a p-type. A direction from the first partial region toward the first electrode is aligned with a first direction. The first nitride region includes $Al_{x1}Ga_{1-x1}N$ ($0 \leq x1 < 1$), is provided between the first partial region and the first electrode, is of the first conductivity type, and includes a first protrusion protruding in the first direction.

20 Claims, 10 Drawing Sheets

(51) Int. Cl.
*H01L 29/16* (2006.01)
*H01L 21/04* (2006.01)
*H01L 21/285* (2006.01)
*H01L 29/45* (2006.01)

(56) References Cited

U.S. PATENT DOCUMENTS

| | | | | |
|---|---|---|---|---|
| 2008/0191190 | A1* | 8/2008 | Tsai | B82Y 20/00 |
| | | | | 257/13 |
| 2009/0008624 | A1* | 1/2009 | Tsai | H01L 21/02439 |
| | | | | 257/13 |
| 2013/0256679 | A1* | 10/2013 | Yao | H01L 21/28575 |
| | | | | 257/76 |
| 2014/0308766 | A1* | 10/2014 | Gaska | H01L 23/482 |
| | | | | 438/22 |
| 2015/0014746 | A1* | 1/2015 | Inada | H01L 29/739 |
| | | | | 257/192 |
| 2015/0076506 | A1* | 3/2015 | Yasumoto | H01L 29/41725 |
| | | | | 257/76 |
| 2016/0043187 | A1* | 2/2016 | Saito | H01L 29/78 |
| | | | | 257/76 |
| 2016/0225863 | A1* | 8/2016 | Simin | H01L 29/404 |
| 2017/0256636 | A1* | 9/2017 | Liu | H01L 29/7787 |
| 2017/0338810 | A1* | 11/2017 | Chen | H01L 27/15 |
| 2019/0115461 | A1* | 4/2019 | Yonehara | H01L 29/40111 |
| 2019/0198346 | A1* | 6/2019 | Cheng | H01L 21/28575 |
| 2019/0267456 | A1* | 8/2019 | Chen | H01L 29/205 |

FOREIGN PATENT DOCUMENTS

| | | | | |
|---|---|---|---|---|
| JP | 2013-065883 A | 4/2013 | | |
| WO | WO-2005124950 A1 * | 12/2005 | | H01S 5/34333 |

* cited by examiner

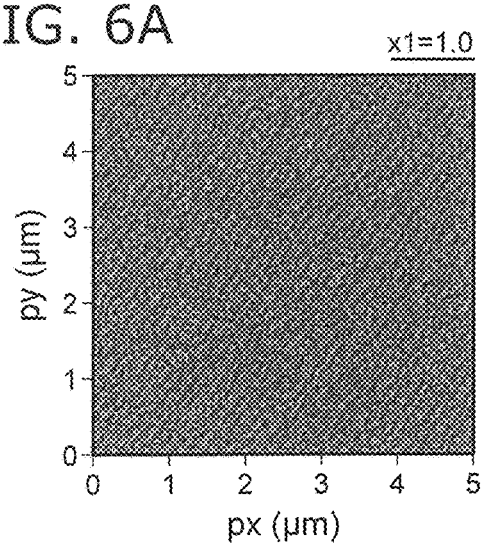
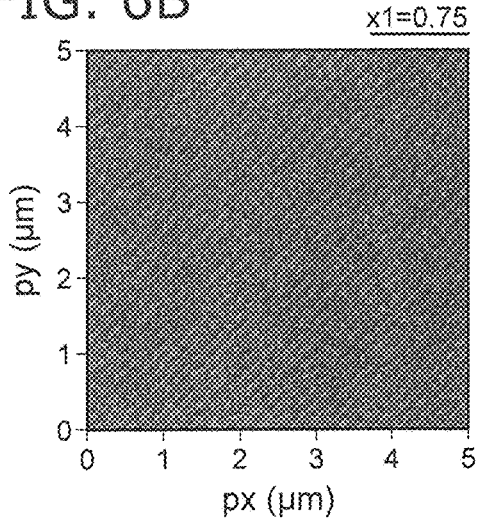
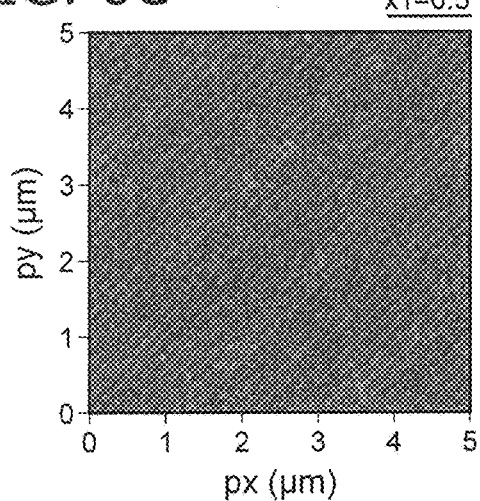
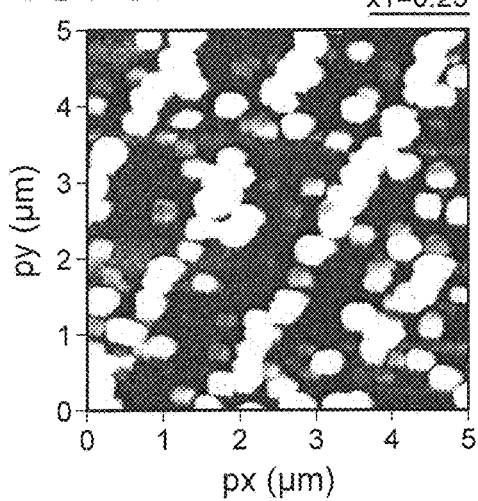
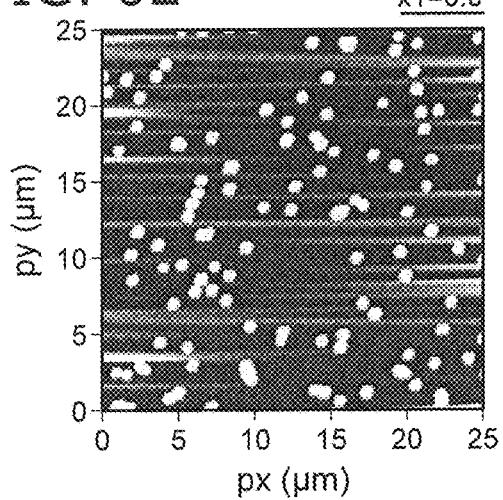
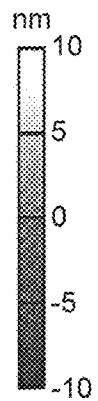

US 10,861,944 B2

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2019-018150, filed on Feb. 4, 2019; the entire contents of which are incorporated herein by reference.

FIELD

Embodiments described herein relate generally to a semiconductor device and a method for manufacturing the same.

BACKGROUND

For example, there is a semiconductor device such as a transistor, a diode, or the like that includes a GaN layer and an AlGaN layer. It is desirable to improve the characteristics of the semiconductor device.

BRIEF DESCRIPTION OF THE DRAWINGS

FIG. 6A to FIG. 6E are AFM images of the surface of the semiconductor device;

DETAILED DESCRIPTION

Figure 1:
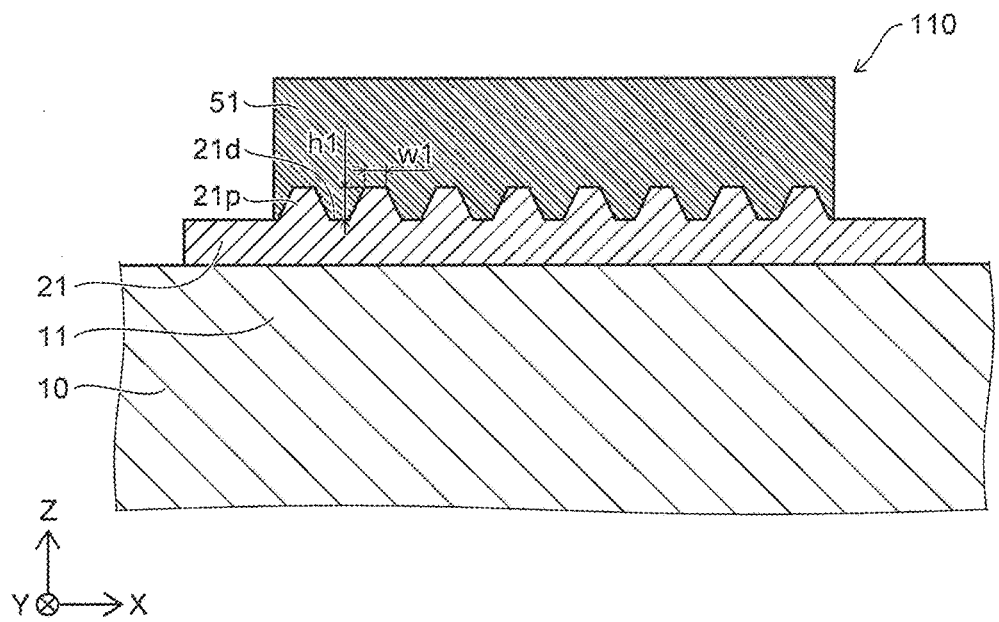
FIG. 1 is a schematic cross-sectional view illustrating a semiconductor device according to a first embodiment.

According to one embodiment, a semiconductor device includes a first layer, a first electrode, and a first nitride region. The first layer includes a first material and a first partial region. The first material includes at least one selected from the group consisting of silicon carbide, silicon, carbon, and germanium. The first partial region is of a first conductivity type. The first conductivity type is one of an n-type or a p-type. A direction from the first partial region toward the first electrode is aligned with a first direction. The first nitride region includes $Al_{x1}Ga_{1-x1}N$ ($0 \leq x1 < 1$), is provided between the first partial region and the first electrode, is of the first conductivity type, and includes a first protrusion protruding in the first direction.

According to one embodiment, a method for manufacturing a semiconductor device is disclosed. The method can include forming a first nitride region on a first layer of a first conductivity type. The first layer includes a first material including at least one selected from the group consisting of silicon carbide, silicon, carbon, and germanium. The first conductivity type is one of an n-type or a p-type. The first nitride region includes $Al_{x1}Ga_{1-x1}N$ ($0 \leq x1 < 1$), includes a first protrusion, and is of the first conductivity type. The method can include forming a first electrode on the first nitride region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first layer 10, a first electrode 51, and a first nitride region 21.

The first layer 10 includes a first material. The first material includes at least one selected from the group consisting of silicon carbide, silicon, carbon, and germanium. The first layer 10 includes a first partial region 11. As described below, the first layer 10 may further include another partial region. The first partial region 11 is of a first conductivity type. The first conductivity type is one of an n-type or a p-type. The other portion of the first layer 10 also may be of the first conductivity type.

In one example, silicon carbide (SiC) is included. The SiC includes, for example, at least one selected from the group consisting of 3C—SiC, 4H—SiC, and 6H—SiC. For example, the first layer 10 (the first material) includes a crystal. The first layer 10 (the first material) may include, for example, diamond. The case will now be described where the first material includes SiC.

The direction from the first partial region 11 toward the first electrode 51 is aligned with a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

For example, the first layer 10 spreads substantially parallel to the X-Y plane. The first partial region 11 of the first layer 10 corresponds to a portion of the first layer 10 opposing the first electrode 51.

The first nitride region 21 is provided between the first partial region 11 and the first electrode 51. The first nitride region 21 includes $Al_{x1}Ga_{1-x1}N$ ($0 \leq x1 < 1$). The first nitride region 21 is, for example, AlGaN or GaN. The composition ratio x1 of Al of the first nitride region 21 is, for example, 0.4 or less. As described below, the composition ratio x1 may be 0.3 or less.

The first nitride region 21 includes a first protrusion 21p. The first protrusion 21p protrudes in the first direction (the Z-axis direction). For example, the first protrusion 21p protrudes in the orientation from the first partial region 11 toward the first electrode 51.

In the example, the first nitride region 21 has a continuous film configuration. For example, the first nitride region 21 further includes a first recessed portion 21d.

The width of the first protrusion 21p corresponds to a length w1 of the first protrusion 21p along a direction perpendicular to the first direction. In one example, the length w1 is not less than 0.1 μm and not more than 10 μm. The length w1 may be, for example, not less than 0.2 μm and not more than 5 μm. The length w1 may be, for example, not less than 0.2 μm and not more than 4 μm.

The height of the first protrusion 21p corresponds to a height h1 of the first protrusion 21p along the first direction. In one example, the height h1 is not less than 10 nm and not more than 2000 nm. The height h1 may be not less than 20 nm and not more than 1000 nm. The height h1 may be not less than 20 nm and not more than 1000 nm.

For example, the first protrusion 21p contacts the first electrode 51. The first nitride region 21 contacts the first electrode 51.

For example, the first protrusion 21p contacts the first partial region 11. The first recessed portion 21d contacts the first partial region 11. For example, the first nitride region 21 contacts the first partial region 11.

The thickness (the length along the first direction) of the first nitride region 21 is, for example, not less than 10 nm and not more than 2000 nm. In the case where the first recessed portion 21d is provided, the thickness of the first nitride region 21 corresponds to the sum of the height h1 of the first protrusion 21p and the thickness (the length along the first direction) of the first recessed portion 21d. In the case where the first recessed portion 21d is not provided, the thickness of the first nitride region 21 corresponds to the height h1 of the first protrusion 21p. The thickness of the first nitride region 21 may be not less than 10 nm and not more than 500 nm.

The first nitride region 21 is of the first conductivity type recited above.

Figure 2:
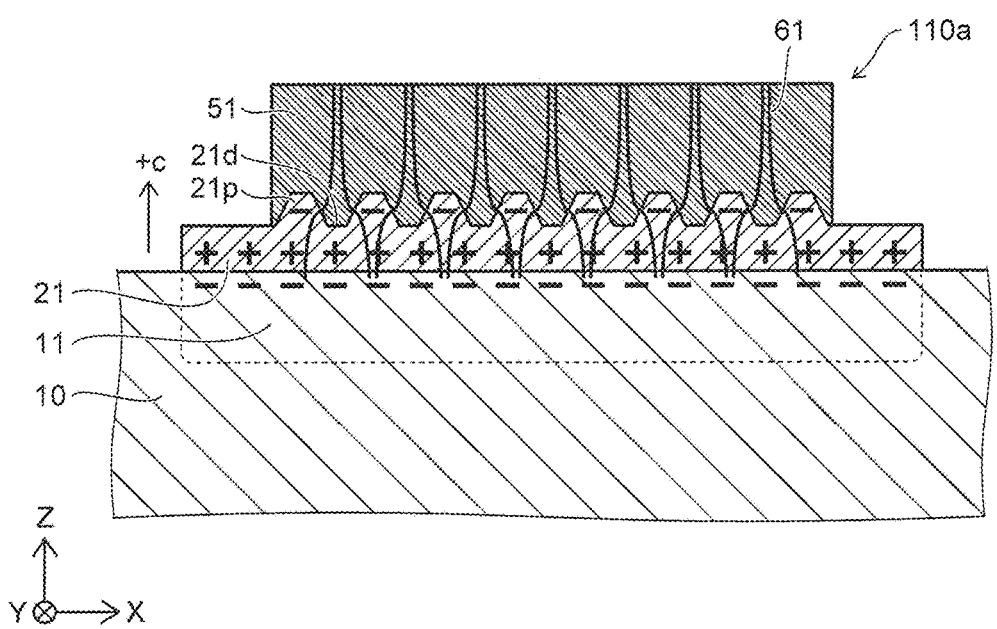
FIG. 2 is a schematic cross-sectional view illustrating a semiconductor device according to the first embodiment.

FIG. 2 is a schematic cross-sectional view illustrating a semiconductor device according to the first embodiment.

In the semiconductor device 110a shown in FIG. 2, the first conductivity type is the n-type. In such a case, the first partial region 11 is $n^+$-SiC. The other portion of the first layer 10 other than the first partial region 11 is, for example, $n^-$-SiC. For example, the first layer 10 includes at least one selected from the group consisting of N, P, and As.

In such a case, the first nitride region 21 is n-type AlGaN or n-type GaN. For example, the first layer 10 includes at least one selected from the group consisting of Si, Ge, Te, and Sn.

As shown in FIG. 2, spontaneous polarization or piezoelectric polarization occurs in the first nitride region 21. By the polarization, a negative charge is generated in the portion of the first nitride region 21 opposing the first electrode 51. On the other hand, a positive charge is generated in the portion of the first nitride region 21 opposing the first partial region 11. Thereby, a high-concentration first conductivity type (an $n^+$-region; negative charge) is induced in the first partial region 11.

As shown in FIG. 2, a current line 61 enters the first partial region 11 via the first electrode 51, the side surface of the first protrusion 21p, and the first nitride region 21. The first electrode 51 and the first partial region 11 are electrically connected with low resistance.

In such a case, for example, the +c axis direction of the first nitride region 21 includes a component in the orientation from the first layer 10 toward the first electrode 51.

Figure 3:
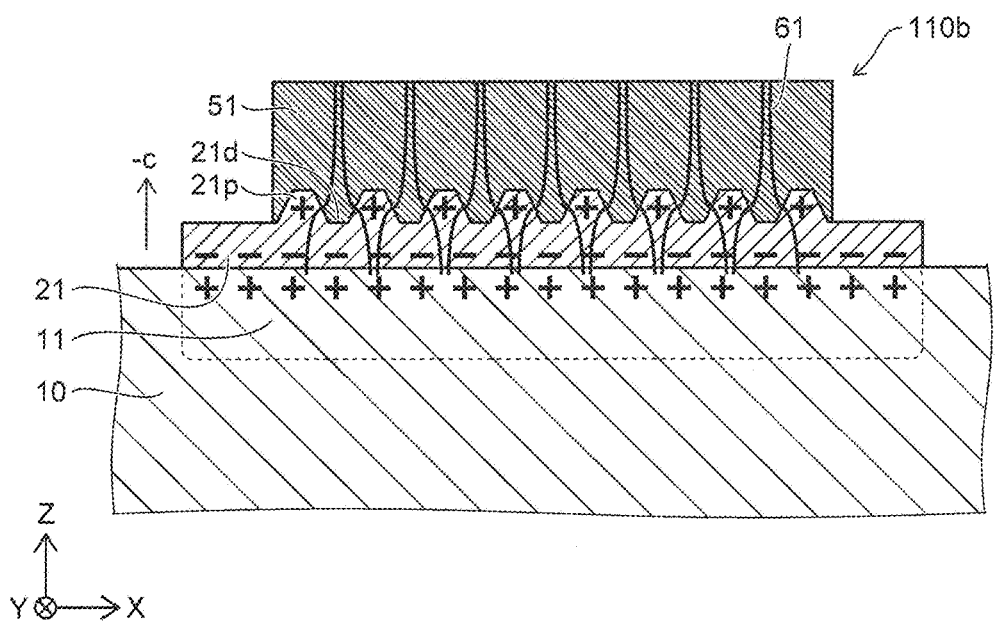
FIG. 3 is a schematic cross-sectional view illustrating a semiconductor device according to the first embodiment.

FIG. 3 is a schematic cross-sectional view illustrating a semiconductor device according to the first embodiment.

In the semiconductor device 110b shown in FIG. 3, the first conductivity type is the p-type. In such a case, the first partial region 11 is $p^+$-SiC. The other portion of the first layer 10 other than the first partial region 11 is, for example, $p^-$-SiC. For example, the first layer 10 includes at least one selected from the group consisting of B, Al, and Ga.

In such a case, the first nitride region 21 is p-type AlGaN or p-type GaN. For example, the first layer 10 includes at least one selected from the group consisting of Mg, Zn, and C.

As shown in FIG. 3, spontaneous polarization or piezoelectric polarization occurs in the first nitride region 21. By the polarization, a positive charge is generated in the portion of the first nitride region 21 opposing the first electrode 51. On the other hand, a negative charge is generated in the portion of the first nitride region 21 opposing the first partial region 11. Thereby, a high-concentration first conductivity type (a $p^+$-region; positive charge) is induced in the first partial region 11.

As shown in FIG. 3, the current line 61 enters the first partial region 11 via the first electrode 51, the side surface of the first protrusion 21p, and the first nitride region 21. The first electrode 51 and the first partial region 11 are electrically connected with low resistance.

In such a case, for example, the $-c$ axis direction of the first nitride region 21 includes a component in the orientation from the first layer 10 toward the first electrode 51.

According to the embodiment, a low contact resistance is obtained. A semiconductor device can be provided in which the characteristics can be improved.

Examples of experimental results will now be described.

In the experiment, the first layer 10 is n-type SiC. Vapor phase epitaxy of n-type $Al_{x1}Ga_{1-x1}N$ is performed as the first nitride region 21 on the first layer 10. In the experiment, the Al composition ratio is modified. In the stacking growth of $Al_{x1}Ga_{1-x1}N$, the V/III ratio is 1100 when the Al composition ratio x1 is 0.25 to 1. The V/III ratio is 38 when the Al composition ratio x1 is 0. Such V/III ratios are low compared to V/III ratios of general conditions.

The first electrode 51 is provided on the $Al_{x1}/Ga_{1-x1}/N$. The first electrode 51 is a stacked film of Au/Ni/Al/Ti. The Ti contacts $Al_{x1}Ga_{1-x1}N$. An ohmic electrode is provided at the lower surface of the first layer 10. The ohmic electrode is a stacked film of W/Ti. The Ti contacts the first layer 10. The first electrode 51 is substantially a circle having a diameter of 100 μm. In the experiment, a voltage is applied between the first electrode 51 and the ohmic electrode; and the current that flows is measured.

Figure 4:
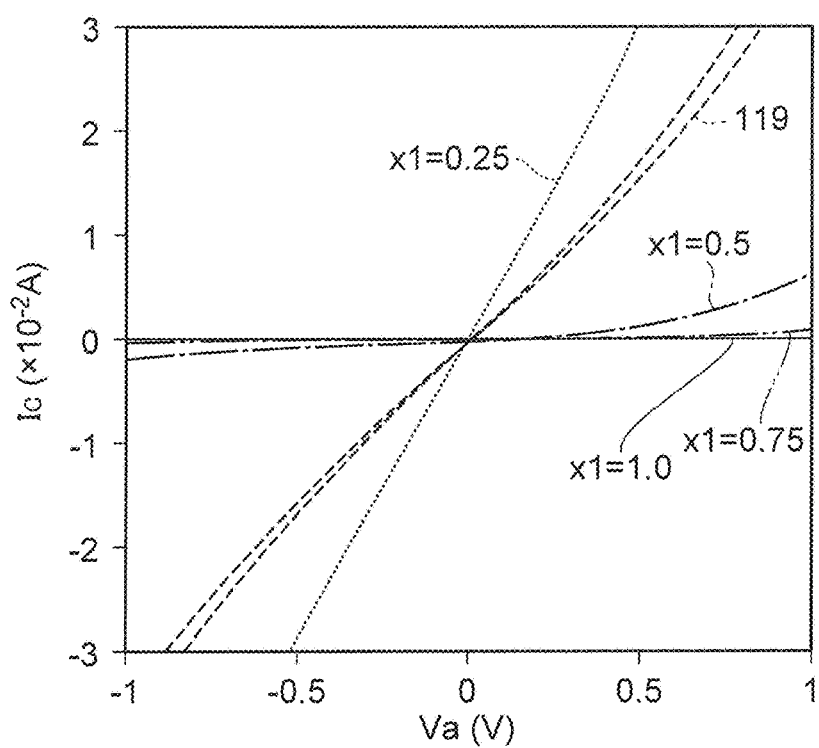
FIG. 4 is a graph illustrating characteristics of the semiconductor device.

FIG. 4 is a graph illustrating characteristics of the semiconductor device.

In FIG. 4, the horizontal axis is an applied voltage Va (V). The vertical axis is a current Ic ($\times 10^{-2}$ A). Characteristics of a semiconductor device 119 in which the first nitride region 21 is not provided also is illustrated in FIG. 4. In the semiconductor device 119, the n-type SiC contacts the first electrode 51.

As shown in FIG. 4, the current Ic changes according to the composition ratio x1 of Al. A large current Ic is obtained when the composition ratio x1 of Al is low. The resistances can be calculated from the characteristics of FIG. 4.

Figure 5:
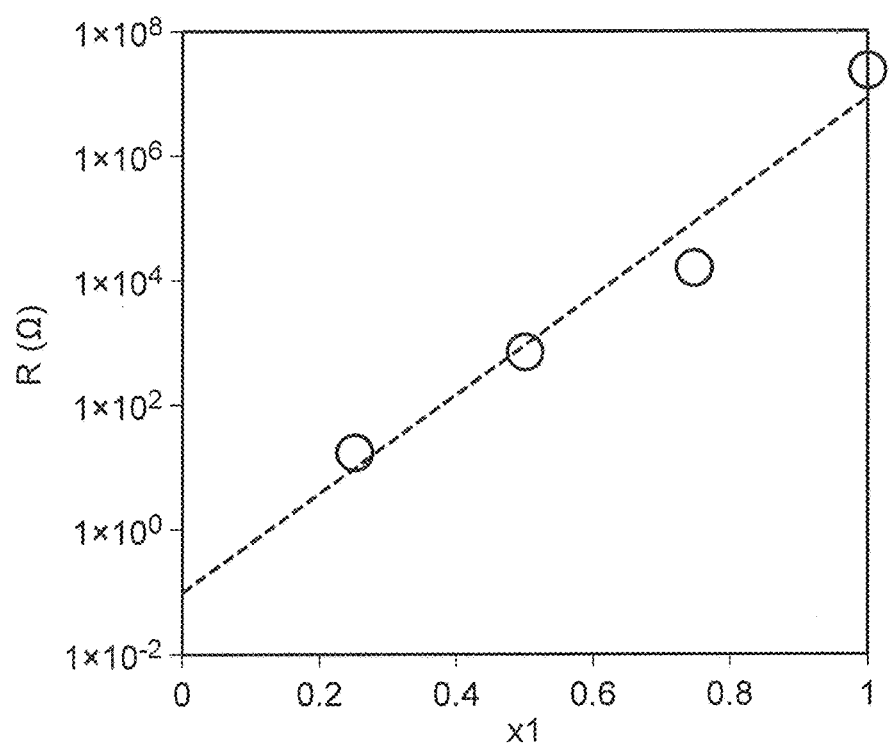
FIG. 5 is a graph illustrating characteristics of the semiconductor device.

FIG. 5 is a graph illustrating characteristics of the semiconductor device.

In FIG. 5, the horizontal axis is the composition ratio x1 of Al. The vertical axis is a resistance R (a). The resistance R is calculated from the characteristics of FIG. 4. As shown in FIG. 4, the resistance decreases as the composition ratio x1 of Al decreases.

FIG. 6A to FIG. 6E are AFM images of the surface of the semiconductor device.

FIG. 6A to FIG. 6E correspond to samples in which the composition ratio x1 of Al is 1, 0.75, 0.5, 0.25, and 0. These figures are AFM images of the surface of the sample after the vapor phase epitaxy of the n-type $Al_{x1}Ga_{1-x1}N$ and before forming the first electrode 51. In the AFM images, the lateral direction is a position px (μm) in the X-axis direction. The vertical direction is a position py (μm) in the Y-axis direction.

It can be seen from FIG. 6A to FIG. 6C that the samples are considered to be substantially flat when the composition ratio x1 of Al is 1, 0.75, and 0.5.

Conversely, it can be seen from FIG. 6D and FIG. 6E that a large unevenness is observed in the samples when the composition ratio x1 of Al is 0.25 and 0.

Figure 7:
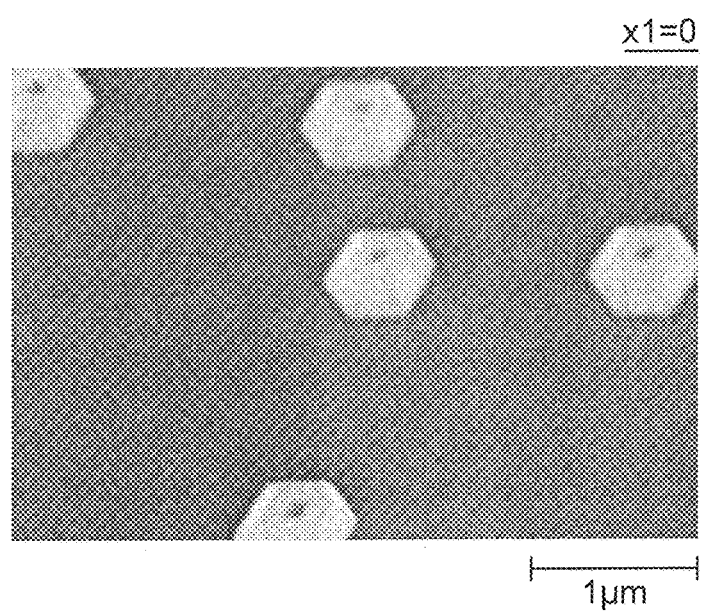
FIG. 7 is a SEM image of the surface of the semiconductor device.

FIG. 7 is a SEM image of the surface of the semiconductor device.

FIG. 7 is a SEM image of the surface of the sample when the composition ratio x1 of Al is 0. As shown in FIG. 7, protrusions are observed in the surface (the SiC surface).

FIG. 8A to FIG. 8E are schematic views illustrating the unevenness of the surface of the semiconductor device. FIG. 8A to FIG. 8E correspond to samples when the composition ratio x1 of Al is 1, 0.75, 0.5, 0.25, and 0. These figures are obtained from AFM images of the surfaces of the samples after the vapor phase epitaxy of the n-type $Al_{x1}Ga_{1-x1}N$ and before forming the first electrode 51. The horizontal axis is the position px (μm) in the X-Y plane. The vertical axis is a height H (nm) of the unevenness.

Figure 8A:
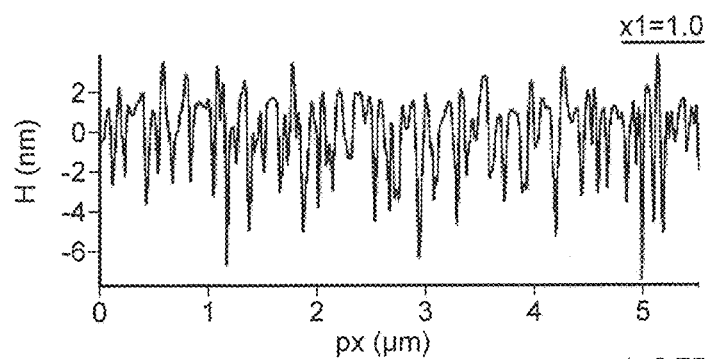
FIG. 8A to FIG. 8E are schematic views illustrating the unevenness of the surface of the semiconductor device.
Figure 8B:
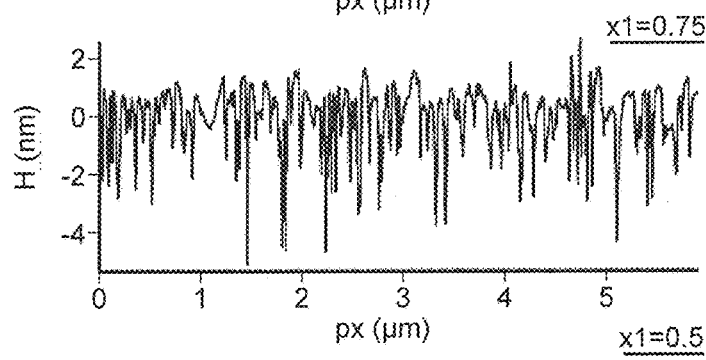
Figure 8C:
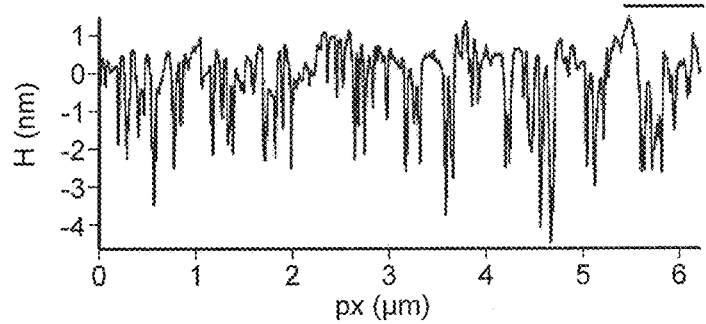

It can be seen from FIG. 8A to FIG. 8C that a fine unevenness is observed for the samples when the composition ratio x1 of Al is 1, 0.75, and 0.5. The height H is about 5 nm. In such cases, it is considered that the surface is substantially flat.

Figure 8D:
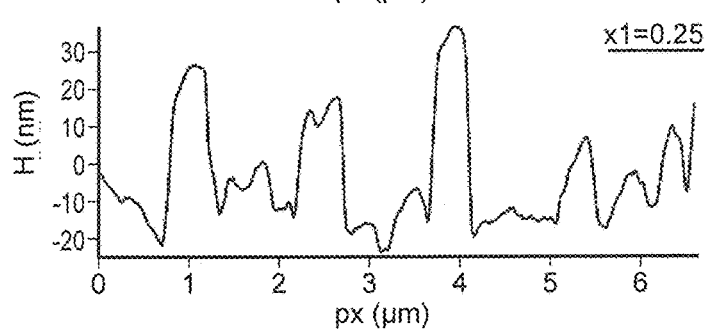
Figure 8E:
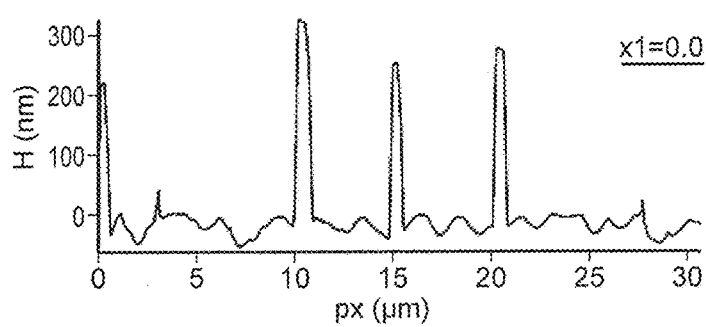

Conversely, it can be seen from FIG. 8D and FIG. 8E that a large unevenness is observed in the samples when the composition ratio x1 of Al is 0.25 and 0. The height H is 10 nm or more. In such cases, it is considered that large protrusions exist in the surface.

Thus, protrusions are formed easily when the composition ratio x1 of Al is low when performing vapor phase epitaxy of n-type $Al_{x1}Ga_{1-x1}N$ on the surface of n-type SiC. It is considered that the $Al_{x1}Ga_{1-x1}N$ grows easily three-dimensionally when the composition ratio x1 of Al is low.

As shown in FIG. 4 and FIG. 5, a low resistance R (a large current Ic) is obtained when the Al composition ratio x1 is 0.25. It is considered that this phenomenon is related to the uneven configuration of the $Al_{x1}Ga_{1-x1}N$. For example, when the unevenness is large, the contact area between the first electrode 51 and the $Al_{x1}Ga_{1-x1}N$ is large. It is considered that the low resistance R is obtained thereby.

Further, it is considered that the bandgap of $Al_{x1}Ga_{1-x1}N$ of the first conductivity type becomes an appropriate value when the composition ratio x1 of Al is low and is 0.4 or less. For example, the bandgap of $Al_{x1}Ga_{1-x1}N$ is matched easily to the bandgap of SiC of the first conductivity type. It is considered that the low resistance R is obtained thereby.

For example, a high-concentration carrier region (an $n^+$-region/$p^+$-region) is formed at the vicinity of the interface between the first partial region 11 and the first nitride region 21 by spontaneous polarization or piezoelectric polarization of $Al_{x1}Ga_{1-x1}N$. A low resistance R is obtained thereby. Also, a lower resistance R is obtained because carriers are injected from the side surface of the first protrusion 21p. A lower resistance R is obtained by the appropriate bandgap.

In the embodiment, the first protrusion 21p can be formed by the appropriate conditions (e.g., the V/III ratio, etc.). The number of processes can be low thereby. To reduce the contact resistance, there is a method of introducing a dopant locally (implantation) and annealing. In such a case, the processes are complex.

In the embodiment, a low contact resistance can be obtained with high productivity. In the embodiment, a semiconductor device in which the characteristic can be improved can be obtained with high productivity.

Figure 9A:
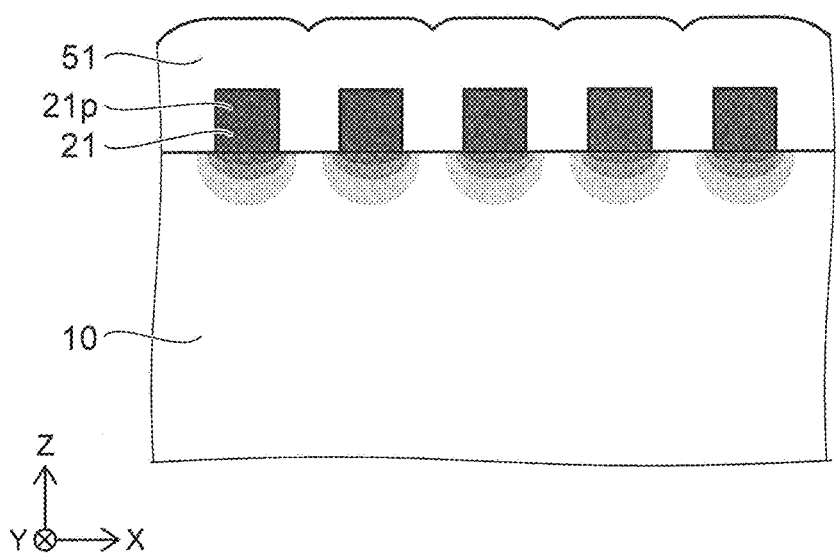
FIG. 9A and FIG. 9B are schematic views illustrating simulation results of characteristics of the semiconductor device.
Figure 9B:
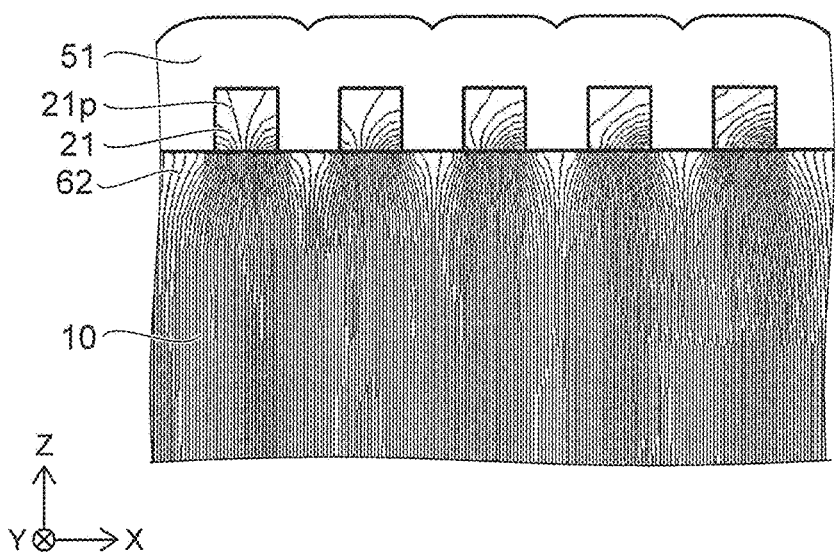

FIG. 9A and FIG. 9B are schematic views illustrating simulation results of characteristics of the semiconductor device.

In these figures, the Al composition ratio x1 in the first nitride region 21 is 0. In such a case, the first nitride region 21 is GaN. In such a case, as shown in FIG. 7, the first nitride region 21 has an island configuration.

FIG. 9A illustrates the carrier concentration distribution. In FIG. 9A, the carrier concentration is high in regions where the concentration of the image is high. It can be seen from FIG. 9A that a high carrier concentration is obtained at the portion of the first layer 10 opposing the first nitride region 21.

FIG. 9B illustrates the current distribution. In FIG. 9B, a line 62 in the drawing corresponds to the current. The current density is high in regions where the density of the lines 62 is high. It can be seen from FIG. 9B that the current flows in the first layer 10 via the side surface of the first protrusion 21p. The current density is high at the portion of the first layer 10 opposing the first nitride region 21.

Figure 10A:
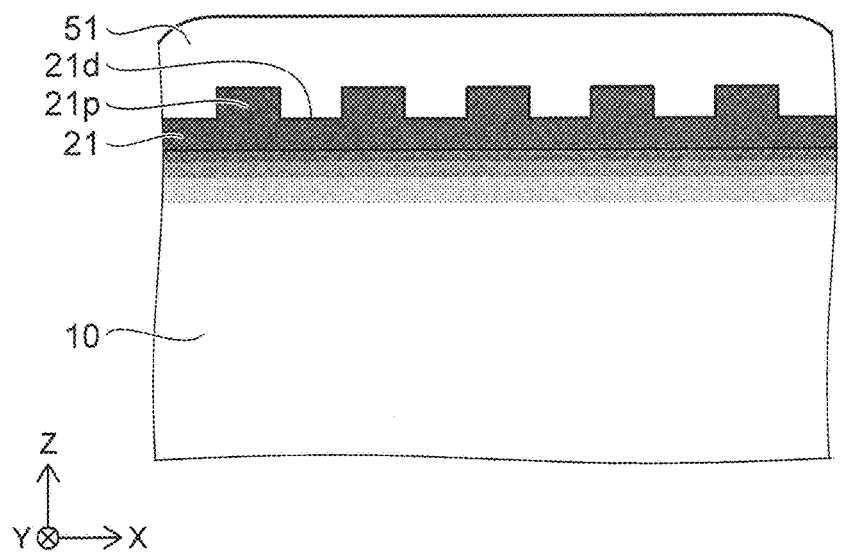
FIG. 10A and FIG. 10B are schematic views illustrating simulation results of characteristics of the semiconductor device.
Figure 10B:
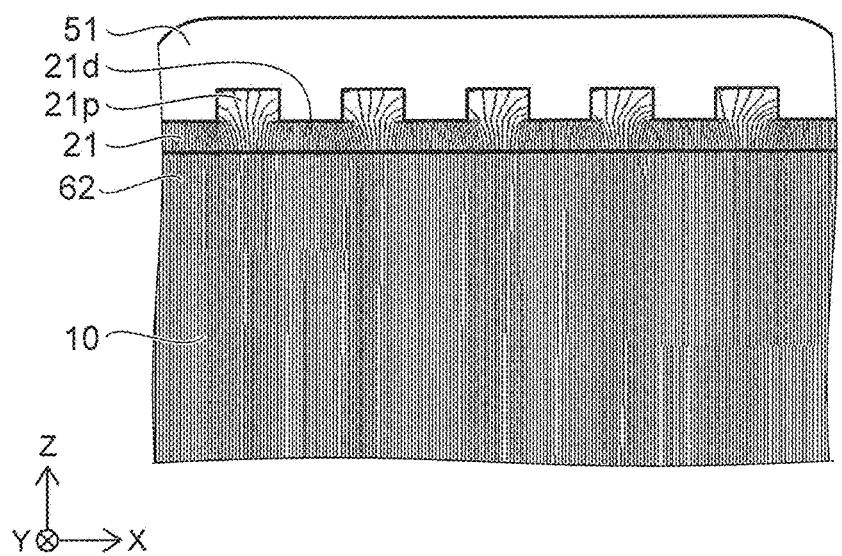

FIG. 10A and FIG. 10B are schematic views illustrating simulation results of characteristics of the semiconductor device.

In these figures, the Al composition ratio x1 in the first nitride region 21 is 0.25. In such a case, the first nitride region 21 is $Al_{0.25}Ga_{0.75}N$. In such a case, the first nitride region 21 is a continuous film. The first nitride region 21 includes the first protrusion 21p and the first recessed portion 21d.

FIG. 10A illustrates the carrier concentration distribution. In FIG. 10A, the carrier concentration is high in regions where the concentration of the image is high. It can be seen from FIG. 10A that a high carrier concentration is obtained in the first layer 10 at the vicinity of the interface with the first nitride region 21.

FIG. 10B illustrates the current distribution. In FIG. 10B, the line 62 in the drawing corresponds to the current. The current density is high in regions where the density of the lines 62 is high. It can be seen from FIG. 10B that the current flows in the first layer 10 via the side surface of the first protrusion 21p. The current flows in the entire first layer 10.

In the first nitride region 21, the first protrusion 21p that has the island configuration easily becomes continuous as the Al composition ratio x1 is increased from 0. For example, there are also cases where the first nitride region 21 has a mesh configuration. The first nitride region 21 may have a mesh configuration or an island configuration. Also, the first nitride region 21 may be a continuous film.

In one example according to the embodiment, the first material of the first layer 10 includes silicon carbide. In such a case, the Al composition ratio x1 is 0.3 or less. The appropriate first protrusion 21p is obtained easily. The Al composition ratio x1 may be 0.25 or less. The appropriate first protrusion 21p is obtained more easily. Also, the bandgaps are matched easily; and a low contact resistance is obtained more easily.

The first layer 10 substantially does not have polarization. On the other hand, the first nitride region 21 has polarization. Thereby, in the first layer 10, a carrier region is induced by the polarization; and the carrier region is induced in the first partial region 11. A lower contact resistance is obtained in the carrier region.

Several examples of the semiconductor device according to the embodiment will now be described.

Figure 11:
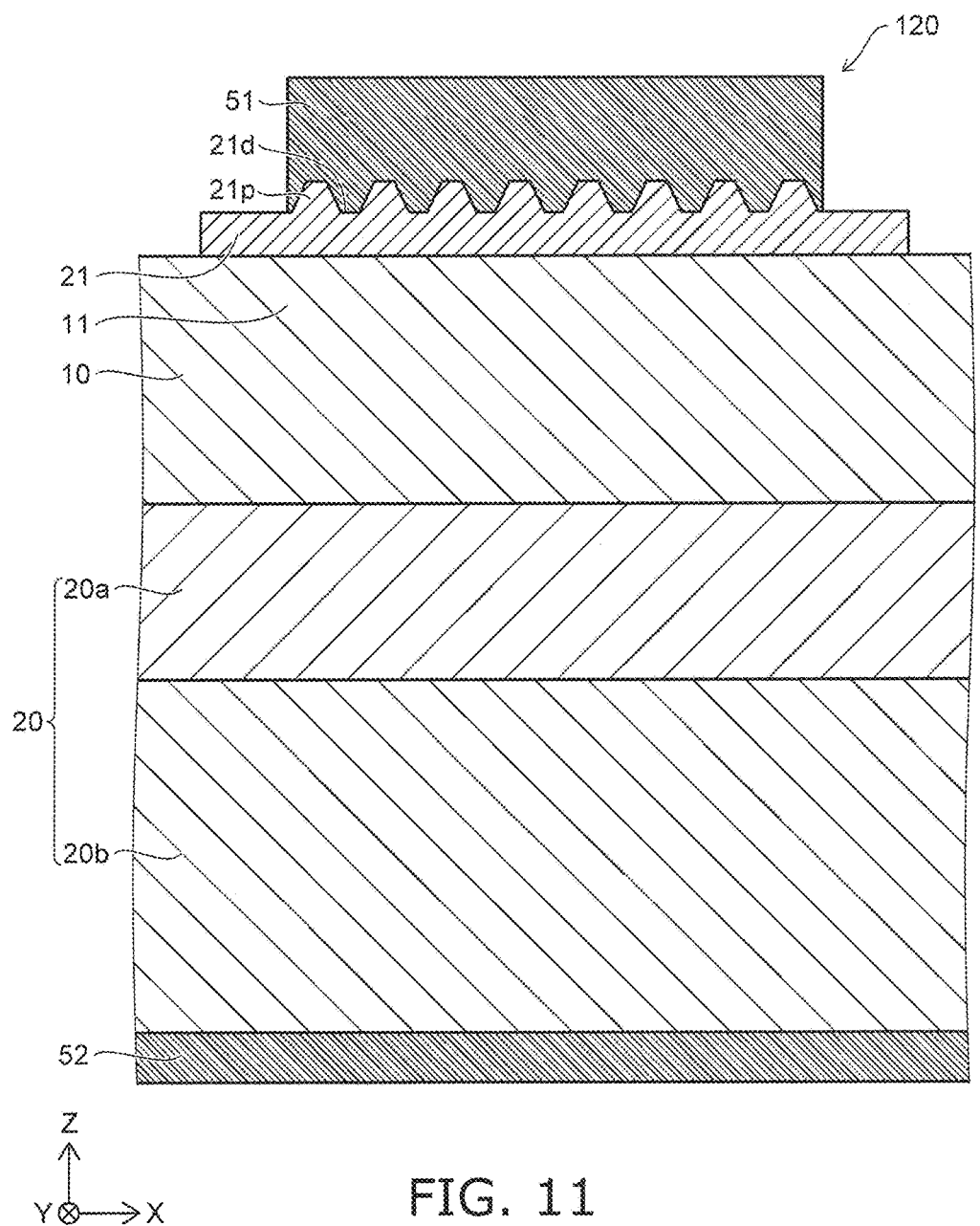
FIG. 11 is a schematic cross-sectional view illustrating a semiconductor device according to the first embodiment.

FIG. 11 is a schematic cross-sectional view illustrating a semiconductor device according to the first embodiment.

As shown in FIG. 11, the semiconductor device 120 according to the embodiment includes a second layer 20 and a second electrode 52 in addition to the first layer 10, the first electrode 51, and the first nitride region 21. The second layer 20 includes the first material recited above (e.g., SiC). The second layer 20 is of a second conductivity type. The second conductivity type is the other of the n-type or the p-type.

Hereinbelow, the first conductivity type is taken to be the p-type; and the second conductivity type is taken to be the n-type. In the example, the second layer includes a first portion 20a and a second portion 20b. The first portion 20a is between the second portion 20b and the first layer 10. The first portion 20a includes, for example, n$^-$-SiC. The second portion 20b includes, for example, n$^+$-SiC. In such a case, the first layer 10 includes p$^-$-SiC. The first partial region 11 includes p$^+$-SiC.

The second electrode 52 is electrically connected to the second layer 20. For example, the second electrode 52 is electrically connected to the second portion 20b.

The semiconductor device 120 is, for example, a diode. In the semiconductor device 120 as well, a low contact resistance is obtained. A semiconductor device is obtained in which the characteristics can be improved.

In the semiconductor device 120, at least a portion of the second layer 20 is between the second electrode 52 and the first electrode 51. At least a portion of the first partial region 11 is between the second layer 20 and the first electrode 51.

Figure 12:
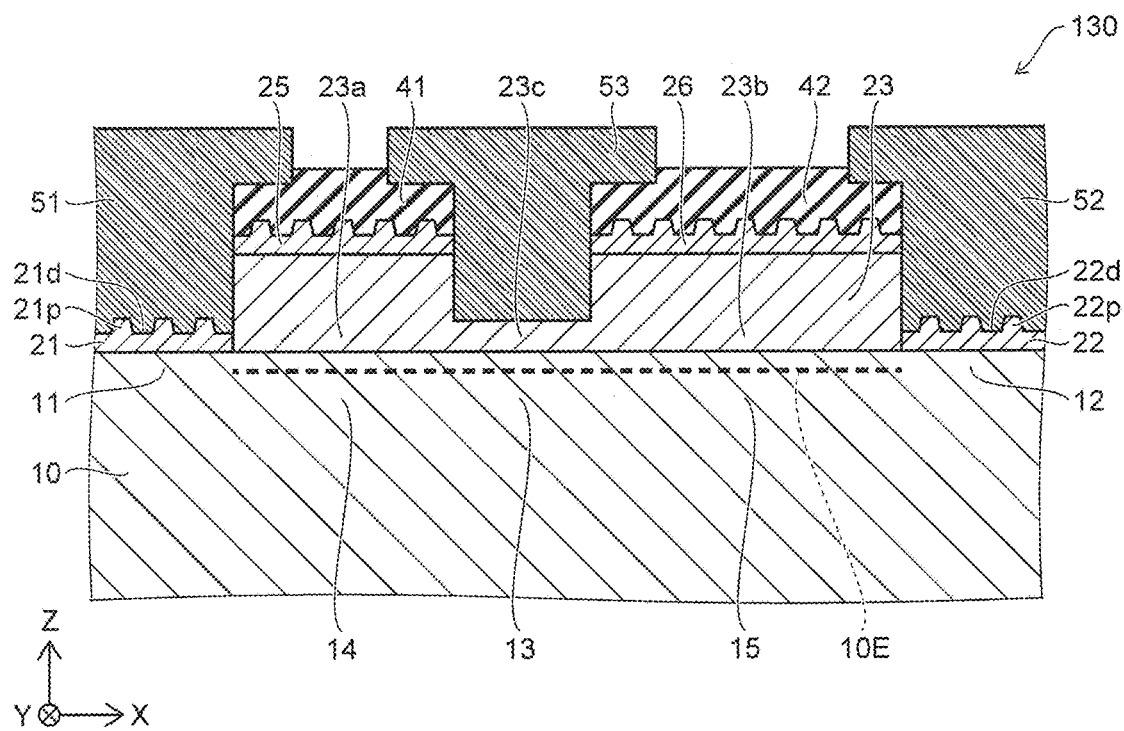
FIG. 12 is a schematic cross-sectional view illustrating a semiconductor device according to the first embodiment.

FIG. 12 is a schematic cross-sectional view illustrating a semiconductor device according to the first embodiment.

As shown in FIG. 12, the semiconductor device 130 according to the embodiment further includes the second electrode 52, a third electrode 53, and a second nitride region 22 in addition to the first layer 10, the first electrode 51, and the first nitride region 21. The second nitride region 22 includes $Al_{x2}Ga_{1-x2}N$ (0≤x2<1). The material (and the configuration) of the second nitride region 22 may be substantially the same as those of the first nitride region 21.

The first layer 10 further includes a second partial region 12 and a third partial region 13 in addition to the first partial region 11. A second direction from the first partial region 11 toward the second partial region 12 crosses the first direction. The second direction is, for example, the X-axis direction. The third partial region 13 is between the first partial region 11 and the second partial region 12.

The direction from the second partial region 12 toward the second electrode 52 is aligned with the first direction (the Z-axis direction). The direction from the third partial region 13 toward the third electrode 53 is aligned with the first direction (the Z-axis direction).

The second nitride region 22 is provided between the second partial region 12 and the second electrode 52. The second nitride region 22 includes a second protrusion 22p. The second protrusion 22p protrudes in the first direction (the Z-axis direction). For example, the second protrusion 22p protrudes in the orientation from the second partial region 12 toward the second electrode 52.

In the example, the second nitride region 22 further includes a second recessed portion 22d. The second nitride region 22 may be a continuous film. The second nitride region 22 may have a mesh configuration or an island configuration.

In the semiconductor device 130 as well, a low contact resistance is obtained between the second partial region 12 and the second electrode 52. A semiconductor device is provided in which the characteristics can be improved.

In one example as shown in FIG. 12, the semiconductor device 130 includes a third nitride region 23. The third nitride region 23 includes a first portion 23a and a second portion 23b. The third nitride region 23 includes $Al_zGa_{1-z}N$ (0<z≤1). The third nitride region 23 is, for example, AlN. The third nitride region 23 may be, for example, AlGaN.

For example, the first layer 10 further includes a fourth partial region 14 and a fifth partial region 15. The fourth partial region 14 is between the first partial region 11 and the third partial region 13 in the second direction (e.g., the X-axis direction). The fifth partial region 15 is between the third partial region 13 and the second partial region 12 in the second direction (e.g., the X-axis direction). The direction from the fourth partial region 14 toward the first portion 23a is aligned with the first direction (the Z-axis direction). The direction from the fifth partial region 15 toward the second portion 23b is aligned with the first direction (the Z-axis direction).

In the example, the third nitride region 23 further includes a third portion 23c. The third portion 23c is between the third partial region 13 and the third electrode 53.

For example, a carrier region 10E is formed in the portion of the fourth partial region 14 opposing the first portion 23a and the portion of the fifth partial region 15 opposing the second portion 23b. The carrier region 10E is, for example, a two-dimensional electron gas. The carrier region 10E may be, for example, a two-dimensional hole gas.

For example, the first electrode 51 functions as a source electrode. For example, the second electrode 52 functions as a drain electrode. For example, the third electrode 53 functions as a gate electrode. For example, the third portion 23c functions as a gate insulating film. The semiconductor device 130 is, for example, a HEMT (High Electron Mobility Transistor).

As shown in FIG. 12, the semiconductor device 130 may further include a nitride region 25 and a nitride region 26. The first portion 23a is between the nitride region 25 and the fourth partial region 14. The second portion 23b is between the nitride region 26 and the fifth partial region 15. The nitride region 25 and the nitride region 26 may have substantially the same configuration as the first nitride region 21.

As shown in FIG. 12, the semiconductor device 130 may include an insulating film 41 and an insulating film 42. The nitride region 25 is between the first portion 23a and the insulating film 41. The nitride region 26 is between the second portion 23b and the insulating film 42.

A portion of the third electrode 53 opposes the third nitride region 23 in the second direction (the X-axis direction). The third electrode 53 is, for example, a trench gate electrode.

The semiconductor device according to the embodiment may include various semiconductor devices based on SiC. For example, the semiconductor device according to the embodiment is applicable to at least one selected from the group consisting of a SiC-FET, a SiC-SBD (a Schottky barrier diode), a SiC-BPD (a bipolar diode), a SiC—P—N (a p-n diode or a p-i-n diode), and a SiC-HEMT. For example, the configuration of the semiconductor device according to the embodiment is applicable to the configuration of the back surface electrode of an element including SiC.

Second Embodiment

A second embodiment relates to a method for manufacturing a semiconductor device.

Figure 13:
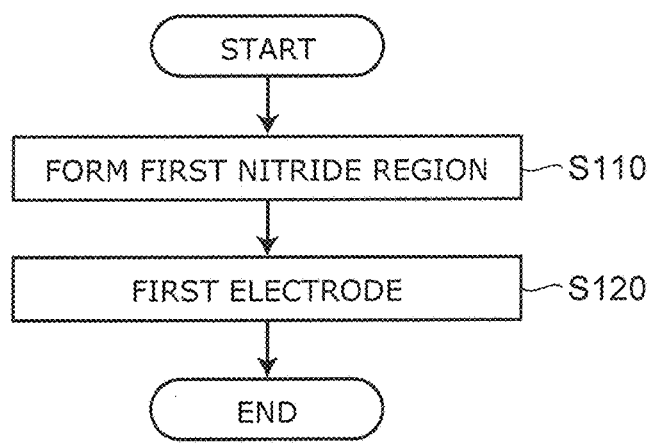
FIG. 13 is a flowchart illustrating the method for manufacturing the semiconductor device according to the second embodiment.

FIG. 13 is a flowchart illustrating the method for manufacturing the semiconductor device according to the second embodiment.

As shown in FIG. 13, the first nitride region 21 is formed on the first layer 10 (step S110). The first layer 10 includes the first material. The first material includes at least one selected from the group consisting of silicon carbide, silicon, carbon, and germanium. The first layer 10 is of the first conductivity type. The first conductivity type is one of the n-type or the p-type. The first nitride region 21 includes $Al_{x1}Ga_{1-x1}N$ ($0 \leq x1 < 1$). The first nitride region 21 includes the first protrusion 21p. The first nitride region 21 is of the first conductivity type recited above.

As shown in FIG. 13, the first electrode 51 is formed on the first nitride region 21 (step S120).

According to such a method for manufacturing the semiconductor device, a low contact resistance is obtained. A method for manufacturing a semiconductor device can be provided in which the characteristics can be improved.

The forming of the first nitride region 21 (step S110) includes supplying, toward the first layer 10, the first source gas including a Group V element and the second source gas including a Group III element. The first source gas is, for example, ammonia. The second source gas includes, for example, TMG and TMA.

For example, the V/III ratio is defined for a source gas including the first source gas and the second source gas. The V/III ratio is the ratio of the number of atoms of the Group V element supplied per unit time to the number of atoms of the Group III element supplied per unit time.

In the embodiment, it is favorable for the V/III ratio to be low. The V/III ratio is, for example, 5000 or less. Thereby, for example, three-dimensional growth is predominant in the formation of the first nitride region 21. Thereby, for example, the first protrusion 21p is obtained easily. The V/III ratio may be, for example, 3000 or less. The V/III ratio may be, for example, 10 or more.

In the case where the V/III ratio is high, an unevenness due to the roughness of the surface occurs due to insufficient migration of the source material element at the semiconductor surface. In such a case, a fine and random surface configuration having a height of about 5 nm forms instead of an unevenness having a height of 10 nm or more such as those illustrated in FIG. 8D and FIG. 8E.

In the embodiment, for example, the nitride regions (the first nitride region 21, etc.) are formed by at least one selected from the group consisting of MOCVD (metal-organic chemical vapor deposition), molecular beam epitaxy (MBE), hydride vapor phase epitaxy (HVPE), sputtering, and pulsed laser deposition.

The configuration described in reference to the first embodiment is applicable to the method for manufacturing the semiconductor device according to the second embodiment.

According to the embodiments, a semiconductor device and a method for manufacturing the semiconductor device can be provided in which the characteristics can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as first layers, second layers, nitride regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first layer including a first material and a first partial region, the first material including at least one selected from the group consisting of silicon carbide, silicon, carbon, and germanium, the first partial region being of a first conductivity type, the first conductivity type being one of an n-type or a p-type;

a first electrode, a direction from the first partial region toward the first electrode being aligned with a first direction; and a first nitride region including $Al_{x1}Ga_{1-x1}N$ ($0 \le x1 < 1$), being provided between the first partial region and the first electrode, being of the first conductivity type, and including a first protrusion protruding in the first direction.

2. The device according to claim 1, wherein a length of the first protrusion along a direction perpendicular to the first direction is not less than 0.2 μm and not more than 5 μm.

3. The device according to claim 1, wherein a height of the first protrusion along the first direction is not less than 10 nm and not more than 1000 nm.

4. The device according to claim 1, wherein the first nitride region further includes a first recessed portion.

5. The device according to claim 1, wherein the first nitride region has a mesh configuration or an island configuration.

6. The device according to claim 1, wherein the first nitride region has a continuous film configuration.

7. The device according to claim 1, wherein the first protrusion contacts the first electrode.

8. The device according to claim 1, wherein the first nitride region contacts the first electrode.

9. The device according to claim 1, wherein the first nitride region contacts the first partial region.

10. The device according to claim 1, wherein a thickness of the first nitride region is not less than 10 nm and not more than 2000 nm.

11. The device according to claim 1, wherein
the first material includes the silicon carbide, and
x1 is 0.3 or less.

12. The device according to claim 11, wherein
the first conductivity type is the n-type, and
a +c axis direction of the first nitride region includes a component in an orientation from the first layer toward the first electrode.

13. The device according to claim 11, wherein
the first conductivity type is the p-type, and
a −c axis direction of the first nitride region includes a component in an orientation from the first layer toward the first electrode.

14. The device according to claim 1, further comprising:
a second layer including the first material and being of a second conductivity type, the second conductivity type being the other of the n-type or the p-type; and
a second electrode electrically connected to the second layer.

15. The device according to claim 14, wherein
at least a portion of the second layer is between the second electrode and the first electrode, and
at least a portion of the first partial region is between the second layer and the first electrode.

16. The device according to claim 1, further comprising:
a second electrode;
a third electrode; and
a second nitride region including $Al_{x2}Ga_{1-x2}N$ ($0 \le x2 < 1$),
the first layer further including a second partial region and a third partial region,
a second direction from the first partial region toward the second partial region crossing the first direction,
the third partial region is being between the first partial region and the second partial region,
a direction from the second partial region toward the second electrode being aligned with the first direction,
a direction from the third partial region toward the third electrode being aligned with the first direction,
the second nitride region being provided between the second partial region and the second electrode,
the second nitride region including a second protrusion protruding in the first direction.

17. The device according to claim 16, further comprising a third nitride region including a first portion and a second portion and including $Al_zGa_{1-z}N$ ($0 < z \le 1$),
the first layer further including a fourth partial region and a fifth partial region,
the fourth partial region being between the first partial region and the third partial region in the second direction,
the fifth partial region being between the third partial region and the second partial region in the second direction,
a direction from the fourth partial region toward the first portion being aligned with the first direction,
a direction from the fifth partial region toward the second portion being aligned with the first direction.

18. The device according to claim 17, wherein
the third nitride region further includes a third portion, and
the third portion is between the third partial region and the third electrode.

19. A method for manufacturing a semiconductor device, comprising:
forming a first nitride region on a first layer of a first conductivity type, the first layer including a first material including at least one selected from the group consisting of silicon carbide, silicon, carbon, and germanium, the first conductivity type being one of an n-type or a p-type, the first nitride region including $Al_{x1}Ga_{1-x1}N$ ($0 \le x1 < 1$), including a first protrusion, and being of the first conductivity type; and
forming a first electrode on the first nitride region.

20. The method according to claim 19, wherein
the forming of the first nitride region includes supplying a first source gas and a second source gas toward the first layer, the first source gas including a Group V element, the second source gas including a Group III element, and
a ratio of a number of atoms of the Group V element supplied per unit time to a number of atoms of the Group III element supplied per unit time is 5000 or less.

* * * * *